United States Patent
Greene et al.

(10) Patent No.: US 7,132,322 B1
(45) Date of Patent: Nov. 7, 2006

(54) METHOD FOR FORMING A SIGE OR SIGEC GATE SELECTIVELY IN A COMPLEMENTARY MIS/MOS FET DEVICE

(75) Inventors: Brian Joseph Greene, Yorktown Heights, NY (US); Kern Rim, Yorktown Heights, NY (US); Clement Wann, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,411

(22) Filed: May 11, 2005

(51) Int. Cl.
*H01L 21/8238* (2006.01)
*H01L 21/8242* (2006.01)
*H01L 21/336* (2006.01)

(52) U.S. Cl. ............ 438/199; 438/242; 438/258; 257/E51.005; 257/E29.137

(58) Field of Classification Search ........ 438/199, 438/529; 257/E51.005, E24.137
See application file for complete search history.

(56) References Cited

U.S. PATENT DOCUMENTS

| | | | |
|---|---|---|---|
| 6,150,205 A * | 11/2000 | Chen et al. | 438/199 |
| 6,248,618 B1 * | 6/2001 | Quek et al. | 438/199 |
| 6,524,902 B1 | 2/2003 | Rhee et al. | |
| 6,709,912 B1 * | 3/2004 | Ang et al. | 438/199 |
| 6,730,588 B1 | 5/2004 | Schinella | |
| 2003/0203554 A1 | 10/2003 | Kubo et al. | |
| 2004/0067631 A1 | 4/2004 | Bu et al. | |
| 2004/0217430 A1 | 11/2004 | Chu | |

OTHER PUBLICATIONS

E.J. Stewart, M.S. Carroll, and James C. Sturm entitled "suppression of Boron Penetration in P-Channel MOSFETS Using Polycrystalline Si 1-x-y GexCy Gate Layers" in IEEE Electron Device Letters, vol. 22, No. 12 (Dec. 2001) pp. 574-576.

E.J. Stewart, M.S. Carroll, and James C. Sturm entitled "Boron Segregation adn Electrical Properties in Polycrystalline Si 1-x-y Gex Cy and Si1-yCy Layers" in JOurnal of applied Physics, vol. 95 No. 8 (Apr. 15, 2004) pp. 4029-4035.

* cited by examiner

*Primary Examiner*—Michael Lebentritt
*Assistant Examiner*—Elias Ullah
(74) *Attorney, Agent, or Firm*—Graham S. Jones, II; H. Daniel Schnurmann

(57) ABSTRACT

Form a dielectric layer on a semiconductor substrate. Deposit an amorphous Si film or a poly-Si film on the dielectric layer. Then deposit a SiGe amorphous-Ge or polysilicon-Ge thin film theteover. Pattern and etch the SiGe film using a selective etch leaving the SiGe thin film intact in a PFET region and removing the SiGe film exposing the top surface of the Si film in an NFET region. Anneal to drive Ge into the Si film in the PFET region. Deposit a gate electrode layer covering the SiGe film in the PFET region and cover the exposed portion of the Si film in the NFET region. Pattern and etch the gate electrode layer to form gates. Form FET devices with sidewall spacers and source regions and drains regions in the substrate aligned with the gates.

20 Claims, 9 Drawing Sheets

METHOD FOR FORMING A SIGE OR SIGEC GATE SELECTIVELY IN A COMPLEMENTARY MIS/MOS FET DEVICE

BACKGROUND OF THE INVENTION

This invention relates to a method of manufacture of MIS (Metal Insulator Semiconductor) and MOS (Metal Oxide Semiconductor) FET (Field Effect Transistor) devices, and more particularly to a method of manufacture of Complementary MIS FET (CMIS) and Complementary MOS FET (CMOS) devices with SiGe gates.

CMIS and CMOS devices include NFET and PFET devices in doped regions in a substrate and counterdoped regions in the substrate respectively. Frequently the region in the substrate in which the PFET devices are formed comprises a counterdoped well in the substrate.

The metal part of a MISFET/MOSFET device is a conductor known as a gate electrode, hereinafter often referred to as gate. The gate electrode is composed of a material such as doped polysilicon or a metal conductor formed above the insulator of the MISFET generally referred to as the gate dielectric layer in a MISFET or gate oxide layer in a MOSFET. The gate electrode is part of a gate electrode stack that includes the gate dielectric layer which is supported on a semiconductor layer or substrate. A channel region is formed in the substrate below the gate dielectric.

A CMIS device or CMOS device includes both NFET (N-channel) devices (with source/drain regions doped with N-type dopant) devices and PFET (P-channel) devices.

A pair of source/drain regions are formed in the substrate juxtaposed with the channel region, generally aligned with the sidewalls of the gate electrode stack. The insulator of such a device is a gate dielectric which separates the gate from the semiconductor substrate upon which the gate dielectric and the gate are formed. In other words, a MIS FET or a MOS FET is a field effect transistor (FET) with a gate formed over an insulator known as a gate dielectric layer which is interposed between a channel region in the semiconductor substrate and the gate. When the gate insulator or gate dielectric insulator of a MISFET is an oxide (typically silicon oxide) the device is known as a Metal Oxide Semiconductor FET (MOSFET) device.

MISFET or MOSFET devices are typically created on the surface of a substrate after either a P-type or a N-type impurity has been implanted in the surface of the substrate, creating wells in this surface of either P-type or N-type conductivity. NMIS or NMOS devices (also referred to as n-channel devices) are, after that, created on the surface of a P-type well. In like manner, PMIS or PMOS devices (also referred to as p-channel devices) are created on the surface of an N-type well.

After the gate has been created, Lightly Doped Drain/Source (LDD/LDS) regions, commonly referred to as LDD regions, are typically implanted in the surface of the substrate, self aligned with the gate, whereby N-type impurities are used for the LDD regions of NMIS/NMOS devices and P-type impurities are used for the LDD regions of PMIS/PMOS devices, which are self aligned with the gates. After this, each of the gates is isolated by the formation of gate spacers on the sidewalls of the gates. This is followed by forming the source and drain regions of the gates which are self aligned with the spacers.

For the source/drain implants the same type impurities are used as have been used for the LDD implants. The difference between the LDD implants and the source/drain implants is that the source/drain implants are typically performed at higher implant energy and dosage that the LDD implants. In this manner the P-type implants (for PMIS/PMOS devices) of the source/drain regions (PS/D) and the n-type implants (for NMIS/NMOS devices) of the source/drain regions (NS/D) penetrate deeper into the surface of the substrate than the corresponding P-type (PLDD) and N-type (NLDD) implants for the LDD regions.

U.S. Pat. No. 6,524,902 of Rhee et al. entitled "Method of Manufacturing CMOS Semiconductor Device" points out that in the fabrication of a CMOS device, boron is doped or implanted into a polysilicon gate layer to form gates of PMOS transistors. The impurity implantation of the p-type doping impurity, e.g. boron, is often carried out along with the formation of the source/drain regions by an ion implantation process. The problem is that where boron is used as a dopant in the impurity implantation, it may diffuse and escape into P-channels through a thin gate insulating layer, unless it is insufficiently planted or activated; and the problem is more serious because the gate insulating layer is very thin. If boron ions escape from the gate in the impurity implantation, boron concentration in the gate near to the gate insulating layer declines and the result is the problem of the Poly-Gate Depletion Effect (PDE). The manufacturing process described by Rhee et al involves blanket deposition of a polysilicon-SiGe layer, followed by formation of additional silicon cap layer formed over the polysilicon SiGe layer. Then phosphorus ions are implanted selectively into an NMOS region, but not into the PMOS region which is covered by an ion implantation mask on the silicon cap layer to cover at least one PMOS transistor region. During a subsequent thermal annealing step, the implanted N-type impurities (phosphorus ions) in the NMOS region enhance diffusion of Ge atoms into the silicon cap layer of the NMOS region, since the annealing step drives Ge atoms in both the downward and upward directions more freely as a result of the ion implantation step. The result is that a desired germanium dopant profile is produced in the SiGe layer and in the silicon layer in the NMOS transistor region, while germanium is substantially prevented from diffusing into the silicon layer in the PMOS transistor region maintaining a high level of Ge near the gate oxide.

The Abstract of an article by E. J. Stewart, M. S. Carroll, and James C. Sturm entitled "Suppression of Boron Penetration in P-Channel MOSFETs Using Polycrystalline $Si_{1-x-y}Ge_xC_y$ Gate Layers" in IEEE Electron Device Letters, VOL. 22, NO. 12, (December 2001) 574–576, states that "Boron penetration through thin gate oxides in p-channel MOSFETs with heavily boron-doped gates causes undesirable positive threshold voltage shifts. P-channel MOS-FETs with polycrystalline $Si_{1-x-y}Ge_xC_y$ gate layers at the gate-oxide interface show substantially reduced boron penetration and increased threshold voltage stability compared to devices with all poly Si gates or with poly $Si_{1-x-y}Ge_x$ gate layers. Boron accumulates in the poly $Si_{1-x-y}Ge_xC_y$ layers in the gate, with less boron entering the gate oxide and substrate. The boron in the poly $Si_{1-x-y}Ge_xC_y$ appears to be electrically active, providing similar device performance compared to the poly Si or poly $Si_{1-x-y}Ge_xC_y$ gated devices."

E. J. Stewart, M. S. Carroll, and James C. Sturm entitled "Boron Segregation and electrical properties in polycrystalline $Si_{1-x-y}C_y$ and $Si_{1-y}C_y$ Layers" in Journal of Applied Physics, VOL. 95, Number 8, (15 Apr. 2004) pp. 4029–4035 "reports strong boron segregation to polycrystalline $Si_{1-x-y}Ge_xC_y$ from polysilicon during thermal anneals . . . ." The article also states "Conventional p-channel MOSFETs with heavily boron-doped polysilicon gates can suffer from voltage instabilities, caused by diffusion from the gate through the gate oxide and into the channel during post implant anneal. Devices with polycrystalline $Si_{1-X-Y}Ge_XC_Y$ layers in the gate have less boron penetration, and greater threshold voltage stability than devices with polycrystalline Si or $Si_{1-X}Ge_X$ gate layers."

U.S. patent application Ser. No. 2004/021743 A1 of Chu entitled "High Performance FET Devices and Methods Therefor" describes a method of fabrication of FET devices in which dopant impurities are prevented from diffusing through the gate insulator. The structure comprises a Si:C, or SiGe:C, layer which is sandwiched between the gate insulator and a layer which is doped with impurities in order to provide a preselected workfunction. The Chu application states that "As the gate insulator is thinned, as dictated by the requirements of ever smaller devices, there is the problem of the doping impurities penetrating the gate insulator, typically an $SiO_2$ layer. For the sake of optimal device design, the gate typically is made of polysilicon, which is doped the same conductivity type as the device itself. With such doping the resultant workfunction of the gate with respect to the channel region of the device allows for the threshold of the device to be optimally set. Accordingly, N-type devices are in need of N-doped gates, and P-type devices are in need of P-doped gates. During the high temperatures of device manufacturing, the gate-doping species, most problematically boron, (B), but others like phosphorus (P) as well, readily penetrates the thin gate insulator and the result is that the gate-doping species destroys the device. The gate insulator in modem high performance devices typically needs to be less than about 3 nm thick. Preventing this dopant penetration would be an important step in achieving thinner gate insulators."

U.S. Patent Publication 2004/0067631 of Bu et al. entitled "Reduction of Seed Layer Roughness for Use in Forming SiGe Gate Electrode" describes how to deposit a "seed" layer to facilitate deposition of a SiGe layer. The method provides for fabricating layers for use in formation of a silicon germanium (SiGe) gate starting with a substrate having a first surface. Then a gate dielectric layer is formed overlying the first surface of the substrate. Next the gate dielectric layer is treated with a gaseous medium to modify a surface characteristic of the gate dielectric. Then, a seed layer is formed overlying the treated gate dielectric thereby mitigating roughness of the seed layer. Then a SiGe layer is formed overlying the seed layer, so that the germanium (Ge) interdiffuses into the seed layer.

U.S. Pat. No. 6,709,912 of Ang et al. entitled "Dual Si-Ge Polysilicon Gate with Different Ge Concentrations for CMOS Device Optimization" describes a method for increasing the amount of Ge over a PMOS region through further implanting and laser annealing. Dual Si-Ge polysilicon gates are formed with different Ge concentrations in the fabrication of an integrated circuit device. An NMOS active area and a PMOS active area of a substrate separated by an isolation region are provided. A gate oxide layer is grown overlying the substrate in both active areas. A polycrystalline silicon-germanium (Si-Ge) layer is deposited overlying the gate oxide layer with the polycrystalline SiGe layer having a first Ge concentration. The NMOS active area is blocked while exposing the PMOS active area and performing successive cycles of Ge plasma doping and laser annealing into the PMOS active area to achieve a second Ge concentration higher than the first Ge concentration. Then, the polycrystalline Si-Ge layer is patterned to form a gate in both active areas. The gate in the PMOS active area has a higher Ge concentration than the gate in the NMOS active area. That completes formation of the dual Si-Ge polysilicon gates with different Ge concentrations in the fabrication of an integrated circuit device.

Referring again to U.S. Pat. No. 6,524,902 of Rhee et al entitled "Method of Manufacturing CMOS Semiconductor Device" the steps of the method are described next. Form a gate insulating layer on a substrate and a SiGe layer having Ge content of more than 20% on the gate insulating layer. Then form a silicon layer on the SiGe layer and form an ion implantation mask on the silicon layer to cover at least one PMOS transistor region. Perform a n-type impurity ion implantation process on at least one NMOS transistor region of the substrate having the ion implantation mask. Perform a diffusion and annealing process on the substrate in which n-type impurities are implanted to diffuse germanium into the silicon layer in the NMOS transistor region to produce a desired germanium dopant profile in the SiGe layer and the silicon layer in the NMOS transistor region, while germanium is substantially prevented from diffusing into the silicon layer in the PMOS transistor region. Then form a gate pattern for PMOS and NMOS transistors by patterning the silicon layer and the SiGe layer. The result of the process is that in the NMOS region where the presence of Ge is unwanted, some SiGe remains present.

In U.S. Pat. No. 6,730,588 of Schinella entitled "Selective deposition of SiGe" a dielectric layer is deposited on a semiconductor wafer. Then a thin silicon layer of amorphous silicon or polycrystalline silicon is deposited on the dielectric layer. A mask is formed over the thin silicon layer, which is used during etching to form a silicon nucleation layer and to expose portions of the dielectric layer. A self-aligned gate is formed by depositing a silicon germanium conducting film on the silicon nucleation layer using a material which selectively deposits on the nucleation layer and which falls to deposit on the exposed portions of the dielectric layer. Then a metal layer is deposited on the top surface of the silicon germanium conducting film. The method employed is very different from that of the present invention.

It is well known that boron activation is superior in poly-SiGe compared to that in polysilicon alone. Thus PFETs with SiGe gates can exhibit a less significant polysilicon depletion effect. The result is that there is a thinner electrical equivalent gate oxide thickness (or inversion thickness), which is beneficial for PFET drive current. In this context, thinner thickness means larger gate capacitance which directly is related to drive current.

However, N type dopant activation in the NFET region may be poorer in the presence of SiGe as evidenced by larger inversion thickness (Tinv) in NFETs with SiGe gates. As employed herein, the term "inversion thickness" (Tinv) is the electrically measured oxide thickness when a MOS device is in inversion. When Tinv is less (thinner) the gate capacitance is greater, leading to a higher drive current.

A serious problem is the "poly depletion effect" which reduces gate capacitance, with the reduced gate capacitance having the disadvantage of reducing device drive current.

SUMMARY OF THE INVENTION

It is an object of this invention to minimize the "poly depletion effect" to retain a high value of gate capacitance thereby providing a high level of device drive current.

Since SiGe and SiGeC increase the Tinv in gates of NFET devices, an object of this invention is to eliminate the presence of SiGe or SiGeC in the NFET region. In other words, an object of this invention is to provide a method for forming SiGe or SiGeC gates only in PFET devices while providing conventional polysilicon gates in NFETs.

In accordance with this invention, a method is provided for forming a SiGe or SiGeC gate solely over the PFETs by a process of initially forming a thin bilayer of a layer of silicon (Si) covered by a layer of germanium (Ge), silicon germanium (SiGe) or SiGeC over the gate dielectric layer in the early stages of formation of the gate electrode. Later in the process, the Ge, SiGe or SiGeC layer is removed from the NFET region, but is retained in the PFET region. Then the device is annealed to diffuse germanium (Ge) into the silicon layer over the PFET region. This method does not rely on implanting Ge into the gate electrode as one prior art reference described, and minimizes the volume of the Ge, SiGe or SiGeC to avoid complications in the gate RIE process.

With the method of this invention, unlike the method of U.S. Pat. No. 6,524,902 of Rhee et al., the entire SiGe layer is etched away in from the NFET region where it is unwanted. Thus there is no SiGe or SiGeC in the NFET region, since the SiGe or SiGeC layer has been removed therefrom.

An advantage of this invention is that boron activation is enhanced by the presence of SiGe or SiGeC in the gate electrode, particularly at the interface with the gate dielectric. Since SiGe or SiGeC allows a higher level of electrical activation of boron the method of this invention minimizes the "poly depletion effect" thereby minimizing the reduction of gate capacitance and thereby avoiding reduced gate capacitance and avoiding the disadvantage of reducing device drive current.

Another advantage of this invention is that the problem often referred to as "boron penetration" in the PFET region is reduced, because the SiGe or SiGeC will retard boron diffusion.

The invention and objects and features thereof will be more readily apparent from the following detailed description and appended claims when taken with the drawings.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

A. Deposit Shallow Trench Isolation (STI) Dielectric in Shallow Trench in Semiconductor Substrate.

Figure 1A:
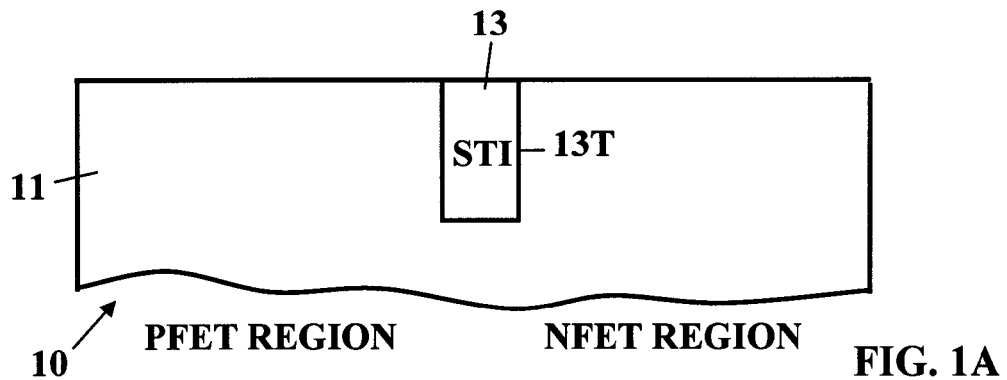
FIGS. 1A–1O illustrate the process steps employed in accordance with the method of this invention.

FIG. 1A is a schematic sectional view of a device 10 in an early stage of manufacture comprising a semiconductor substrate 11 with a top surface in which a shallow trench 13T has been formed. The shallow trench 13T is filled with a Shallow Trench Isolation (STI) dielectric 13 formed in accordance with step 31 in FIGS. 2–4. The STI dielectric 13 separates the PFET regions on the left side of the semiconductor substrate 11 from the NFET regions on right side of semiconductor substrate 11, as will be well understood by those skilled in the art.

The substrate 11 can comprise bulk Silicon (Si), Silicon on Insulator (SOI), bulk Germanium (Ge), Si/SiGe bilayers, or Si/SiGe on insulator. Also the device structure 10 could be modified to be in the form of 3D FETs such as FinFET devices, as will be well understood by those skilled in the art of FinFET devices.

Figure 2:
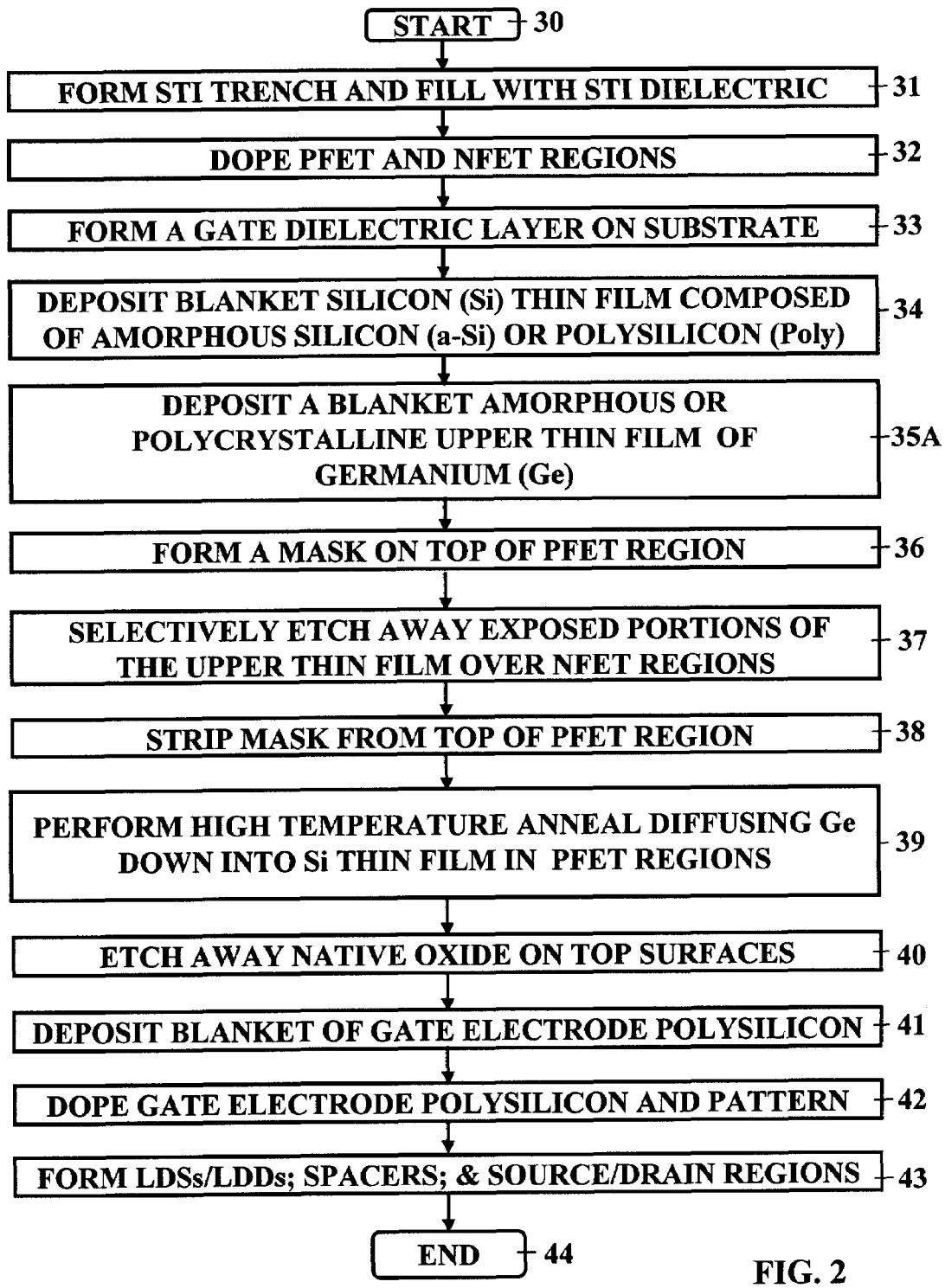
FIG. 2 shows the processing flow chart of the method of this invention in which a bilayer is formed in which a layer of silicon is deposited followed by a layer of germanium.
Figure 3:
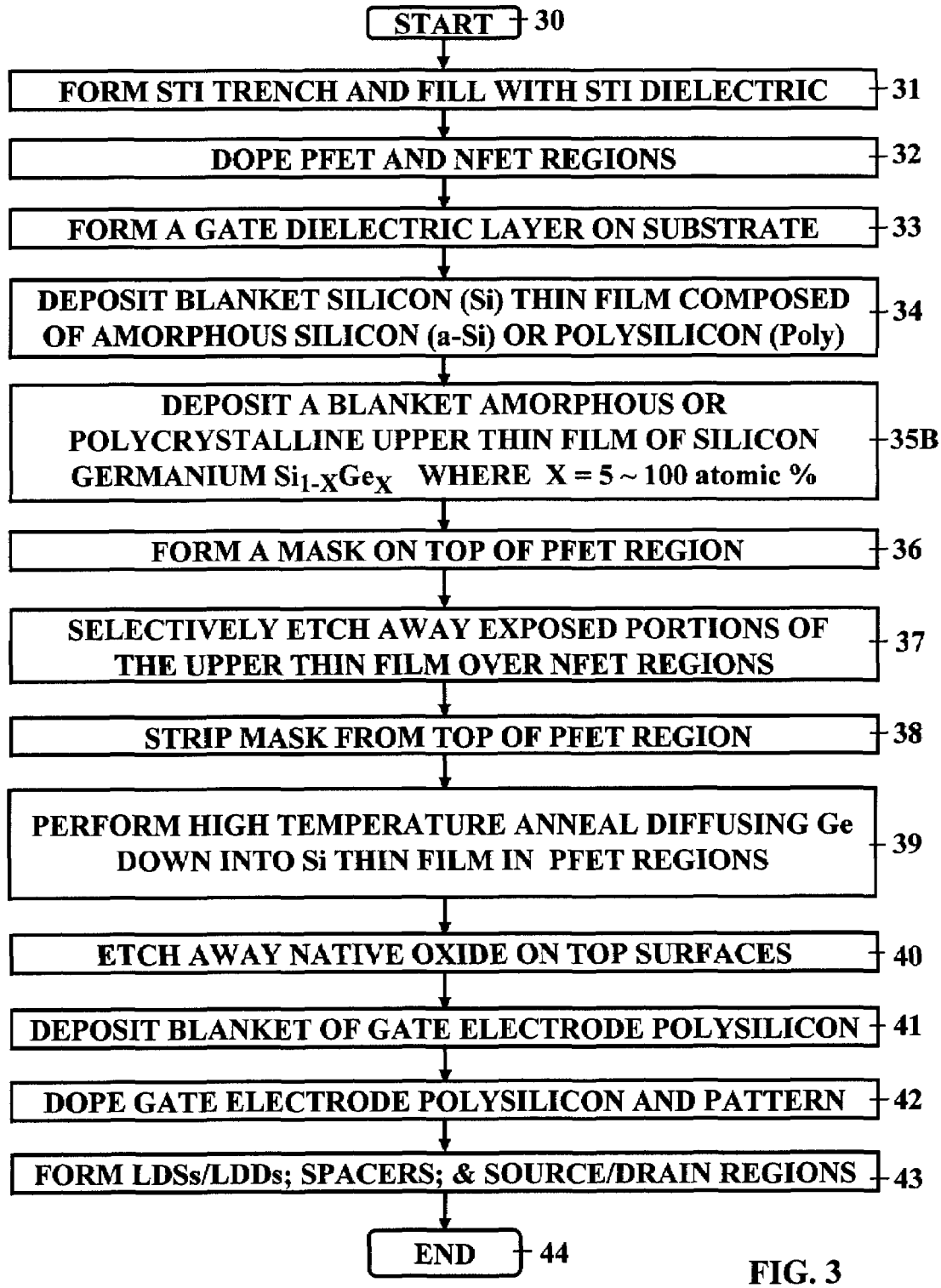
FIG. 3 shows the processing flow chart of the method of this invention in which a bilayer is formed in which a layer of silicon is deposited followed by a layer of silicon-germanium.
Figure 4:
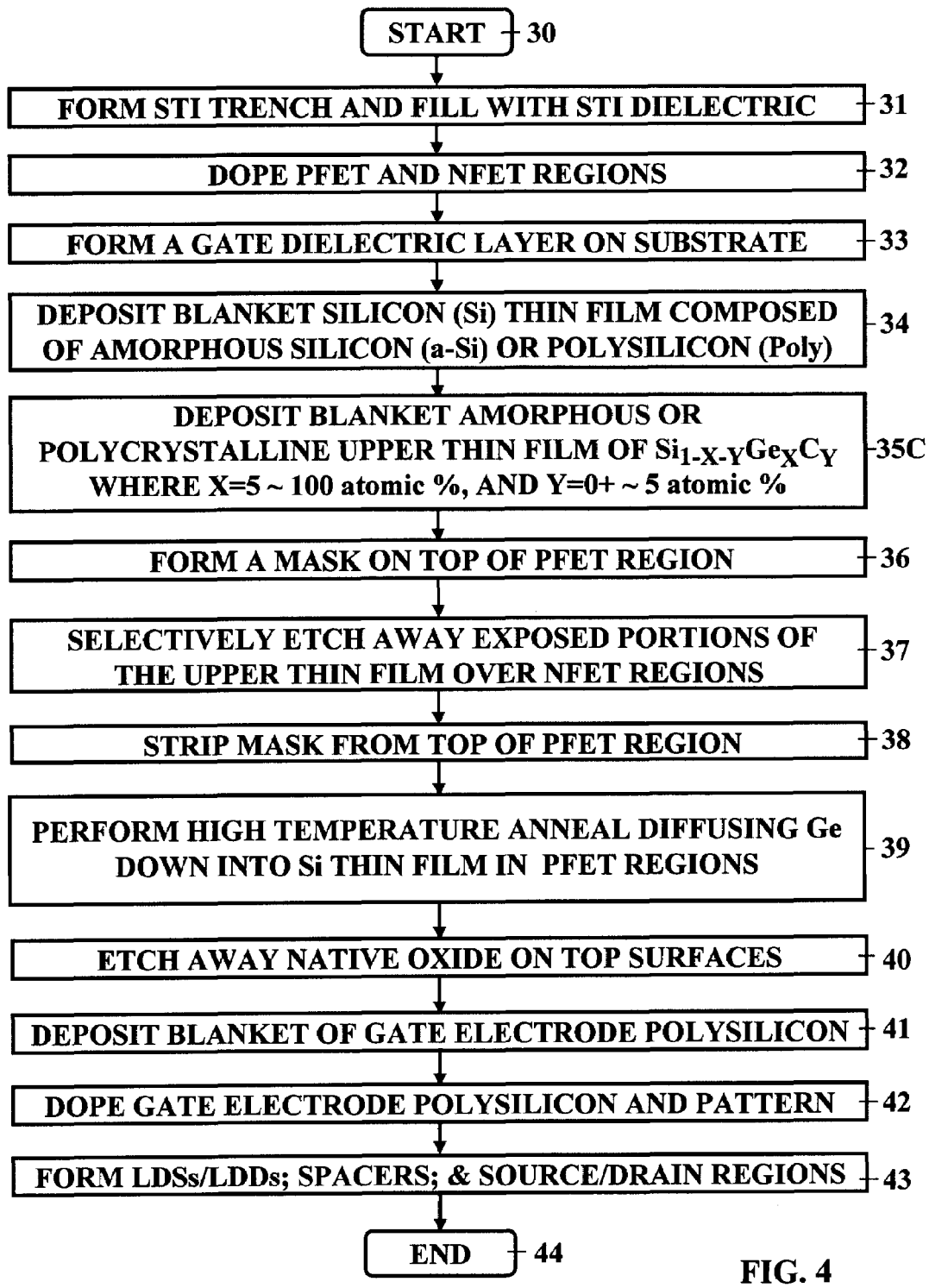
FIG. 4 shows the processing flow chart of the method of this invention in which a bilayer is formed in which a layer of silicon is deposited followed by a layer of silicon-germanium-carbon.

As specified in step 32 in FIGS. 2–4, the next step is to dope PFET and NFET regions in the substrate 11 one at a time.

B. Dope PFET Regions in the Semiconductor Substrate.

Figure 1B:
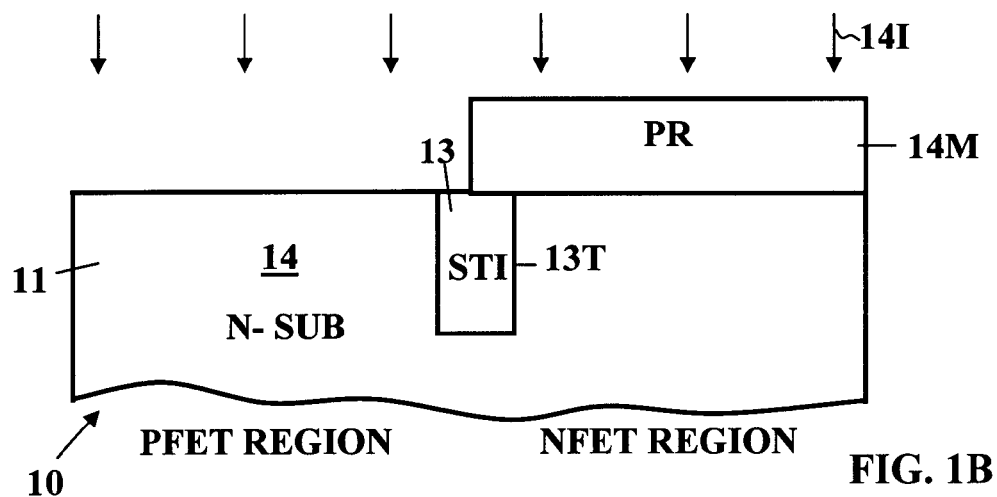

FIG. 1B shows the device 10 of FIG. 1A during performance of the first part of the step 32 in FIGS. 2–4 in which a first temporary photolithographic (preferably photoresist PR) mask 14M was formed over the NFET region on the right side of the STI dielectric 13 in shallow trench 13T in device 10, while the PFET region on the left side of the STI dielectric 13 in shallow trench 13T in device 10 was being doped with N-dopant ions 14I thereby forming an N-SUB 14 to the left side of the STI trench 13T. Preferably the N-SUB 14 comprises an N-well formed in the substrate 11. Then the mask 14M is stripped exposing the top surface of the NFET region.

C. Dope NFET Regions in the Semiconductor Substrate.

Figure 1C:
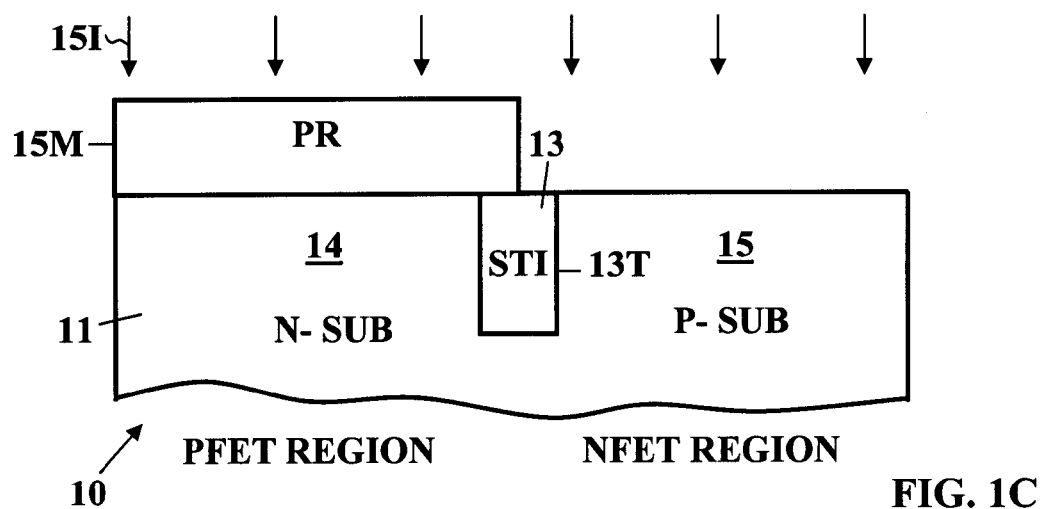

FIG. 1C shows device 10 of FIG. 1B during performance of the second part of step 32 (FIGS. 2–4) in which a second temporary photolithographis (preferably photoresist PR) mask 15M has been formed over the PFET region on the left side of the STI dielectric 13 in the shallow trench 13T the device 10, while the NFET region on the right side of device 10 is shown being doped with P-dopant ions 15I thereby forming a P-SUB 15 to the right side of the shallow trench 13T. Then the mask 15M is stripped exposing the top surface of the P-SUB 15 in the PFET region.

In the doping provided in FIGS. 1B and 1C, a dopant level of from about 1e17 to about 1e18 atoms of dopant is preferred although not critical. Preferably highly localized halo doping is employed that goes up to about 1e19 atoms of dopant typically. As will be well understood by those skilled in the art a pad oxide layer which is conventionally employed is not shown for convenience of illustration and to make a more concise presentation of the invention.

D. Form Blanket Gate Dielectric Layer Over Substrate Including STI Dielectric.

Figure 1D:
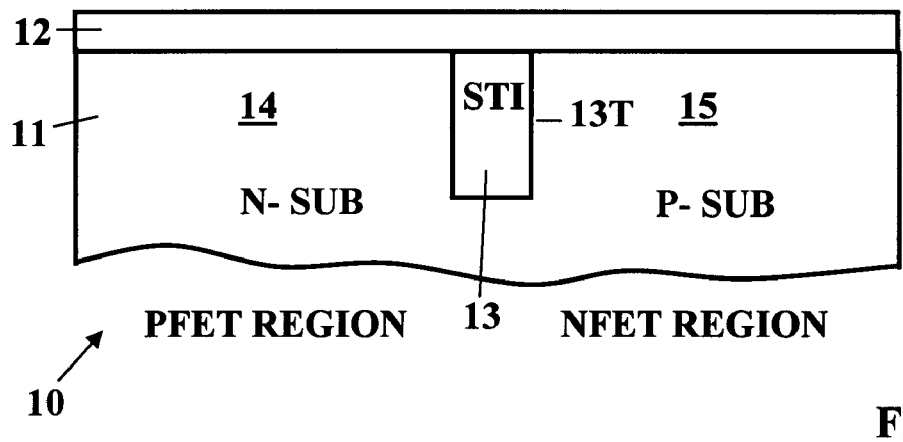

FIG. 1D shows the device 10 of FIG. 1C after step 33 in FIGS. 2–4 in which a blanket, thin gate dielectric layer 12 has been formed covering the substrate 11 and the STI dielectric. The gate dielectric layer 12, which is typically from about 0.8 nm to about 10 nm thick, is deposited preferably by a method such as thermal oxidation or chemical deposition. Preferably, the gate dielectric layer 12 is composed of a material selected from the group consisting of silicon oxide, silicon oxynitride, halfnium oxide, halfnium silicate, aluminum oxide, aluminum silicate, silicon nitride, zirconium oxide, zirconium silicate, tantalum oxide, tantalum silicate. Materials with similar characteristics can be employed.

E. Deposit a Blanket Thin Silicon Layer Composed of Amorphous Silicon or Polysilicon.

Figure 1E:
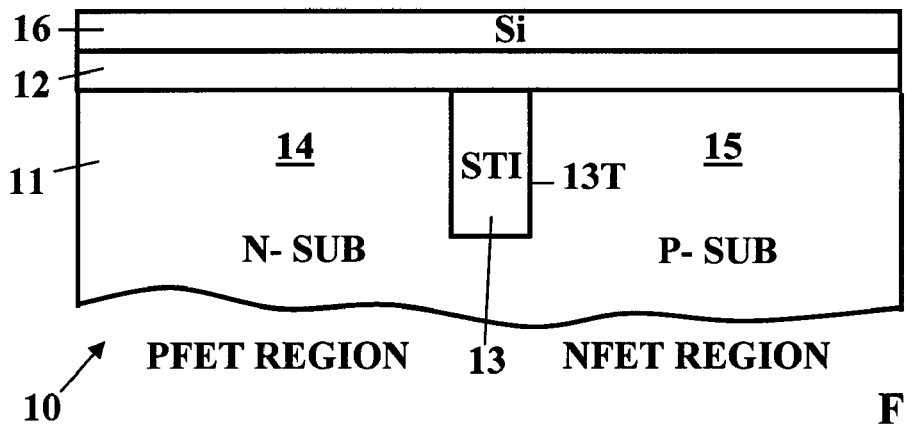
Figure 1F:
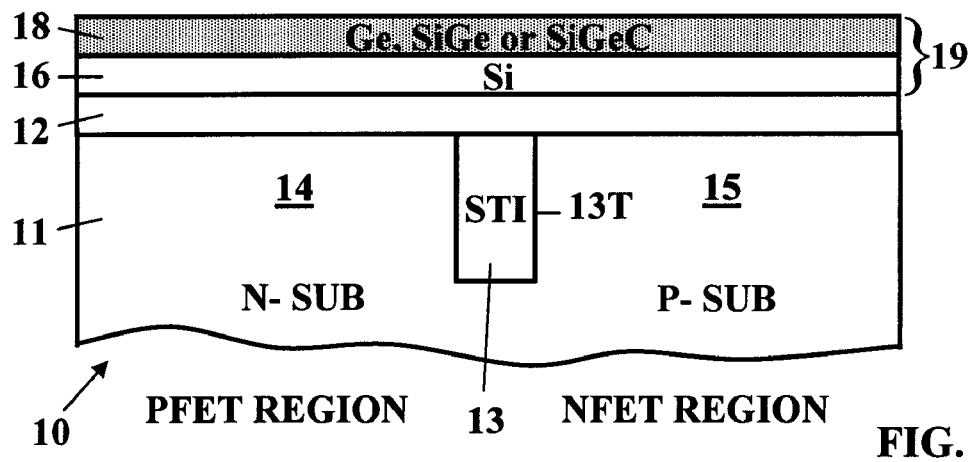

FIG. 1E shows the device 10 of FIG. 1D after step 34 in FIGS. 2–4 in which the first silicon thin film 16 of a thin bilayer 19 composed of silicon-germanium/silicon (SiGe/Si)

which is shown in FIG. 1F has been formed. Alternatively, the thin film 18 may be composed of silicon-germanium-carbon/silicon (SiGeC/Si) as is also indicated in FIG. 1F. The lower, silicon thin film 16, which was deposited on gate dielectric layer 12, is preferably composed of amorphous silicon, but can be composed of polysilicon. If the first, silicon, thin film 16 comprises amorphous silicon (a-Si) film 16, it preferably has a thickness typically from about 10 nm to about 20 nm which is deposited by a process such as Low Pressure Chemical Vapor Deposition (LPCVD) process or Atmospheric Pressure Chemical Vapor Deposition (APCVD) process. For deposition of an amorphous silicon (a-Si) thin film 16, the process can begin with a typical precursor such as silane ($SiH_4$) or dichlorosilane ($SiH_2Cl_2$). Preferably, the amorphous silicon (a-Si) thin film 16 is deposited by LPCVD at a temperature of between about 490° C. and 540° C., a pressure of between about 0.05 Torr and 50 Torr, and with a $SiH_4$ flow of between about 100 slm and 1500 slm.

FIG. 1F shows the device 10 of FIG. 1E after step 35A in FIG. 2, step 35B in FIG. 3, AND step 35c in FIG. 4.

F1. Deposit a Thin Film of Amorphous or Polycrystalline Germanium (Ge).

In accordance with FIG. 1F and FIG. 2, an upper, silicon, thin film 18 of the thin bilayer 19 has been formed composed of an amorphous germanium (a-Ge) deposit or polycrystalline germanium (poly Ge) deposit. The Ge thin film 18, which is preferably composed of an amorphous germanium (a-SiGe), has been deposited on the thin Si film 16.

F2. Deposit a Thin Film of Amorphous Silicon-Germanium (a-SiGe) or Polycrystalline Silicon-Germanium (poly SiGe).

In accordance with FIG. 1F and FIG. 3, an upper, silicon-germanium, second thin film 18 of the thin bilayer 19 has been formed composed of an amorphous silicon-germanium (a-SiGe) deposit or polycrystalline silicon-germanium (poly SiGe) deposit. The SiGe thin film 18, which is preferably composed of an amorphous silicon-germanium (a-SiGe), has been deposited on the thin Si film 16.

F3. Deposit a Thin Film of Amorphous Silicon-Germanium-Carbon (a-SiGeC) or Polycrystalline Silicon-Germanium-Carbon (poly SiGeC).

In accordance with FIG. 1F and FIG. 4, the second, upper, silicon-germanium-carbon thin film 18 of the thin bilayer 19 has been formed composed of an amorphous silicon-germanium-carbon (a-SiGeC) or polycrystalline silicon-germanium (poly SiGe-carbon). The SiGeC thin film 18, which is preferably composed of an amorphous silicon-germanium (a-SiGeC), has been deposited on the thin Si film 16.

The Ge, SiGe or SiGeC upper thin film 18, which has a thickness typically from about 10 nm to about 20 nm is deposited by with a Low Pressure Chemical Vapor Deposition (LPCVD) or Atmospheric Pressure Chemical Vapor Deposition (APCVD) process. Preferred precursors for the silicon and the germanium in the a-SiGe layer are silane ($SiH_4$) or dichlorosilane ($SiH_2Cl_2$) for silicon, and germane ($GeH_4$) for germanium. A silane flow of between about 100 slm and 1500 slm is preferred or dichlorosilane flow of between about 100 slm and 1500 slm is preferred. The SiGe or SiGeC thin film 18 comprises an atomic percentage ratio of $Si_{1-X-Y}Ge_XC_Y$, where X=5 atomic % to 100 atomic % and Y=0+ % to 5%. If the layer 29 contains carbon (as in SiGeC), the atomic percentage of carbon would be from a trace (0+ %) to 5%, preferably, a trace (0+ %) to 2%.

Techniques for depositing silicon-germanium alloys are well known in the art, for example as described in U.S. Pat. No. 5,336,903 entitled "Selective Deposition of Doped Silicon-Germanium Alloy on Semiconductor Substrate, and Resulting Structures", which is incorporated by reference in its entirety. As stated above, the SiGe conductive film may be amorphous or polycrystalline. Deposition occurs by creating a gaseous environment comprising silane ($SiH_4$) and germane ($GeH_4$) in a ratio that precludes deposition on the exposed dielectric material. Other gaseous sources of silicon may be provided including dichlorosilane ($SiH_2Cl_2$). The dielectric is typically $SiO_2$, but in other embodiments, may be any other material that precludes nucleation of SiGe film when suitable ratios of germane and silane (or other sources of silicon) are used. The SiGe conductive film may be deposited using low pressure chemical vapor deposition (LPCVD) techniques familiar to those of skill in the art. It is expected that the selected deposition of the silicon germanium conductive film may be achieved at a temperature range of about 300 to 800 degrees C. In one embodiment, the ratio of germane to silane or dichlorosilane ($SiH_2Cl_2$) is selected such that no deposition of the SiGe conductive film occurs on the dielectric layers. It is expected that ratios of germane to dichlorosilane in the amounts of about 0.025 to about 1.00 will produce suitable results. A pressure of about 2.5 Torr is suitable. In a preferred embodiment, a temperature of about 600° C. is used for the LPCVD process and a ratio of germane to dichlorosilane ($SiH_2Cl_2$) of 0.20 is used. The process may also be adapted to use silane by one of skill in the art with minimal experimentation. Similar process parameter ranges are expected to produce suitable results when silane is used as the gaseous source for silicon. The precise ratio of silane to germane for selective deposition of SiGe conductive films may be empirically determined and is a function of the partial pressures of $GeH_4/SiH_4$, temperature, and total pressure.

G. Form A Mask on Top of PFET Region.

Figure 1G:
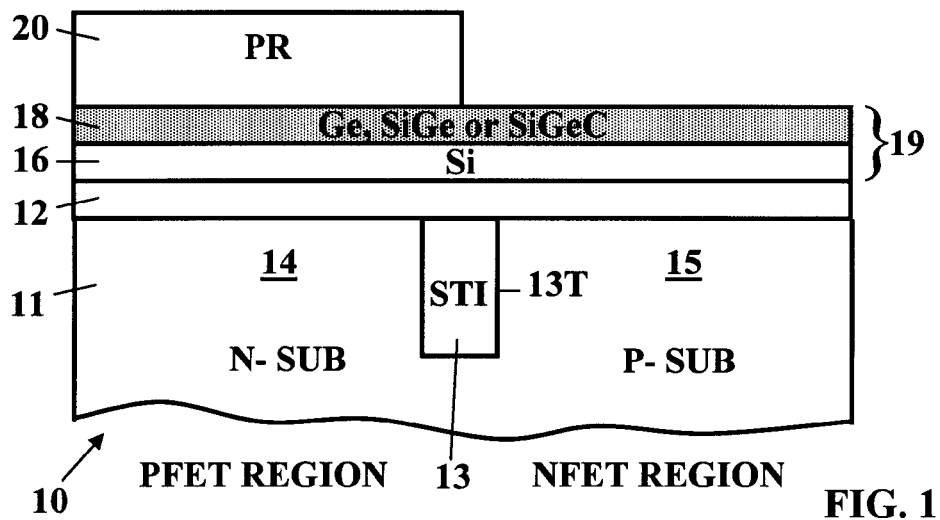

FIG. 1G shows the device 10 of FIG. 1F after step 36 in FIGS. 2–4 in which a photolithographic mask 20 (photoresist or the like) has been formed over the N-Sub 14 (i.e. the PFET region on the left) in the device 10, leaving the NFET region (on the right) of the device 10 exposed. The method of formation of such a photolithographic mask will be well understood by those skilled in the art. Alternatively, a thin layer of silicon oxide or silicon nitride can be deposited or thermally grown on top of Si/SiGe layer followed by the photolithographic step. In this case, the dielectric layer (silicon oxide or silicon nitride) is then patterned by an etch step before proceeding to the next step.

H. Selectively Etch Away Exposed Portions of the a-SiGe or Poly Si-Ge Layer Over NFET Regions.

Figure 1H:
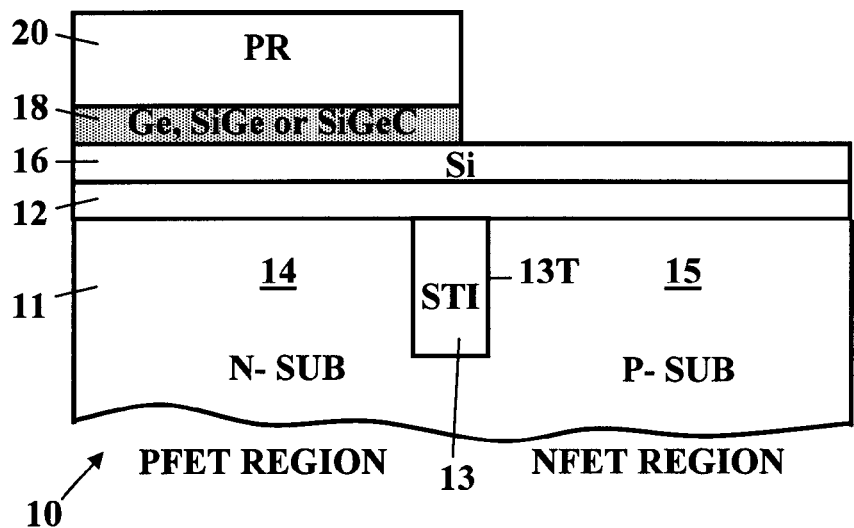

FIG. 1H shows the device 10 of FIG. 1G after the exposed portion of the SiGe or SiGeC thin film 18 was removed by selective etching (step 37A in FIG. 2 and step 37B in FIG. 3) in the NFET region exposing the surface of the silicon thin film 16 above the P-Sub 15 (in the NFET region), while leaving the underlying silicon thin film 16 above the gate dielectric over P-Sub 15. One etchant that can be used in steps 37A/37B is an aqueous solution of $NH_4OH:H_2O_2:H_2O$ at a temperature of about 65° C. Other etchants that are selective to Si can be used as will be well understood by those skilled in the art.

I. Strip Mask From PFET Region and Anneal to Diffuse Ge into a-Si or Si Layer in the PFET Region Yielding Poly Si-Ge or Poly Si-Ge-C Bilayer in the PFET Region.

Figure 1I:
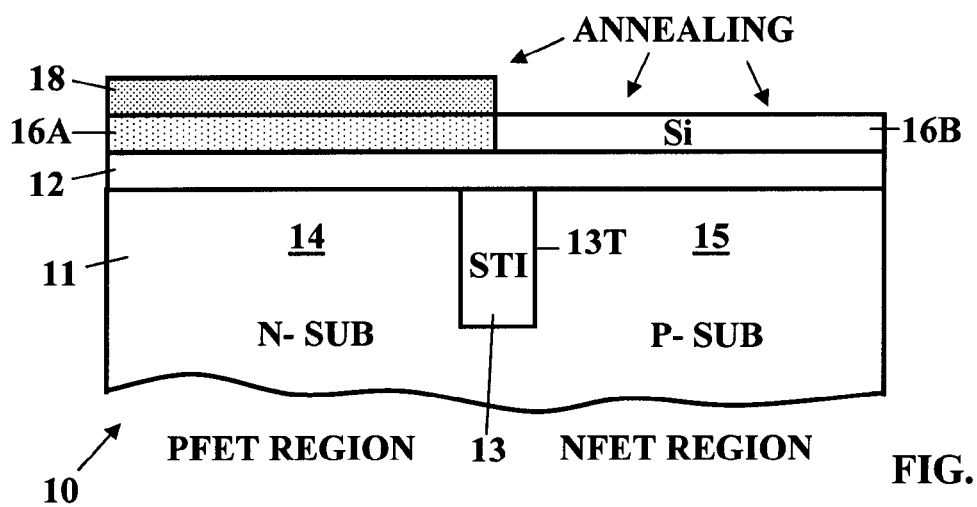

FIG. 1I shows the device 10 of FIG. 1H after stripping the mask 20 (step 38 in FIGS. 2–4, optionally including the optional silicon oxide or silicon nitride mask) and then subjection of device 10 to the high temperature annealing for the purpose of interdiffusing some of the Ge atoms from the upper thin film 18 downward into the Si thin film 16 above the N-Sub in the PFET region, converting Si thin film 16 into a polysilicon-Ge thin film 16A. The portion of the Si lower thin film 16 above the P-sub 15, remains a polysilicon, thin film 16B, as before the annealing step. In other words, in the PFET region, the concentrated Ge atoms in the upper SiGe/SiGeC thin film 18 are partially diffused down into the lower layer, but many of the Ge atoms remain in the upper SiGeC thin film 18 so that both layers have close to the same concentration of Ge. The performance of a high temperature annealing process of step 39A in FIG. 2 and step 39B in FIG. 3, which is preferably performed within a temperature range from a minimum of about 800° C. to a maximum of about 1200° C. Preferably the maximum is about 1100° C. During the high temperature annealing process, the amorphous silicon in layers 16 and 18 is converted to polysilicon. Upon annealing if the material contains amorphous silicon, it is converted into polysilicon.

J. Etching to Remove Native Oxide.

Figure 1J:
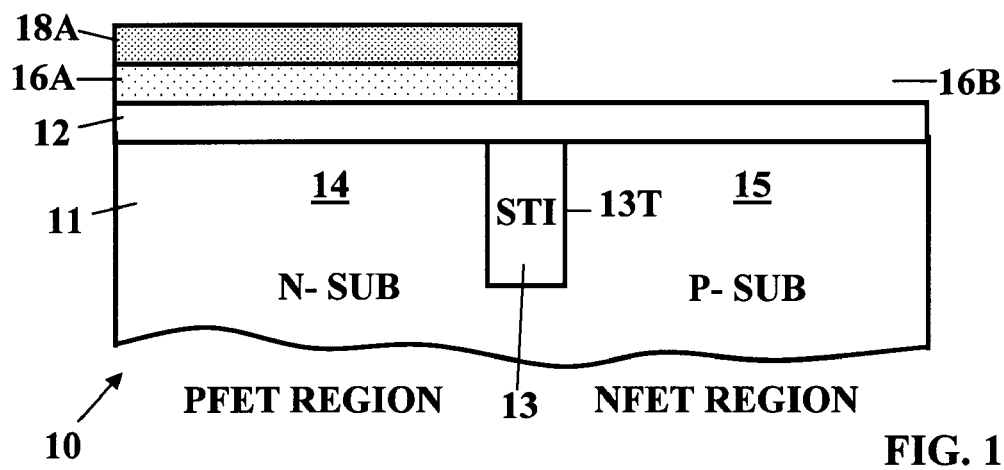

FIG. 1J shows the device 10 of FIG. 11 during removal of a native oxide layer (step 40 in FIGS. 2–4) which may have formed during annealing was removed by dipping the device into a aqueous hydrofluoric acid solution. The silicon oxide or silicon nitride mask, if not removed in the previous step, can be removed at this step as well.

K. Deposit Blanket Layer of Gate Electrode Polysilicon.

Figure 1K:
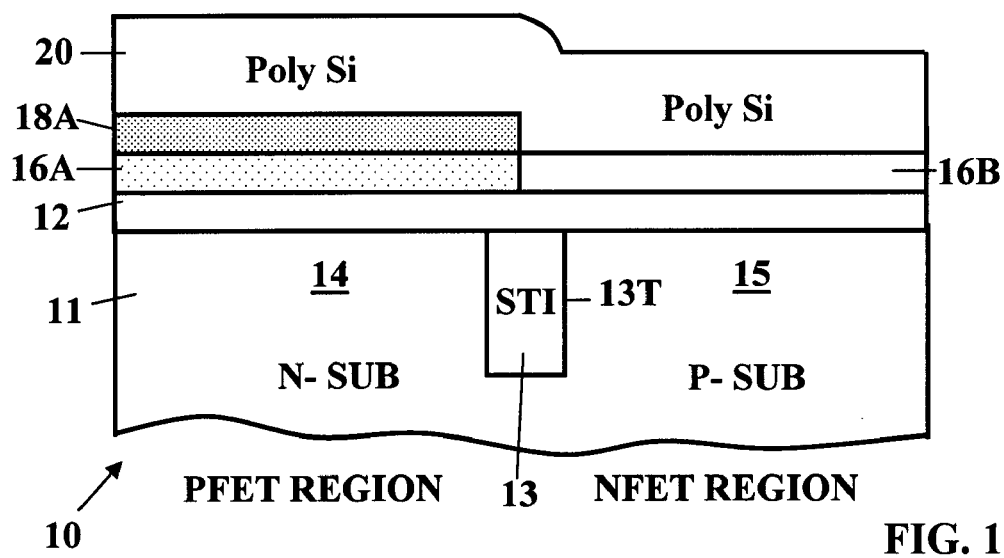

FIG. 1K shows the device 10 of FIG. 1J and after a blanket layer 20 of polysilicon Si was deposited over both the NFET and PFET regions (step 41 in FIGS. 2–4).

Figure 1L:
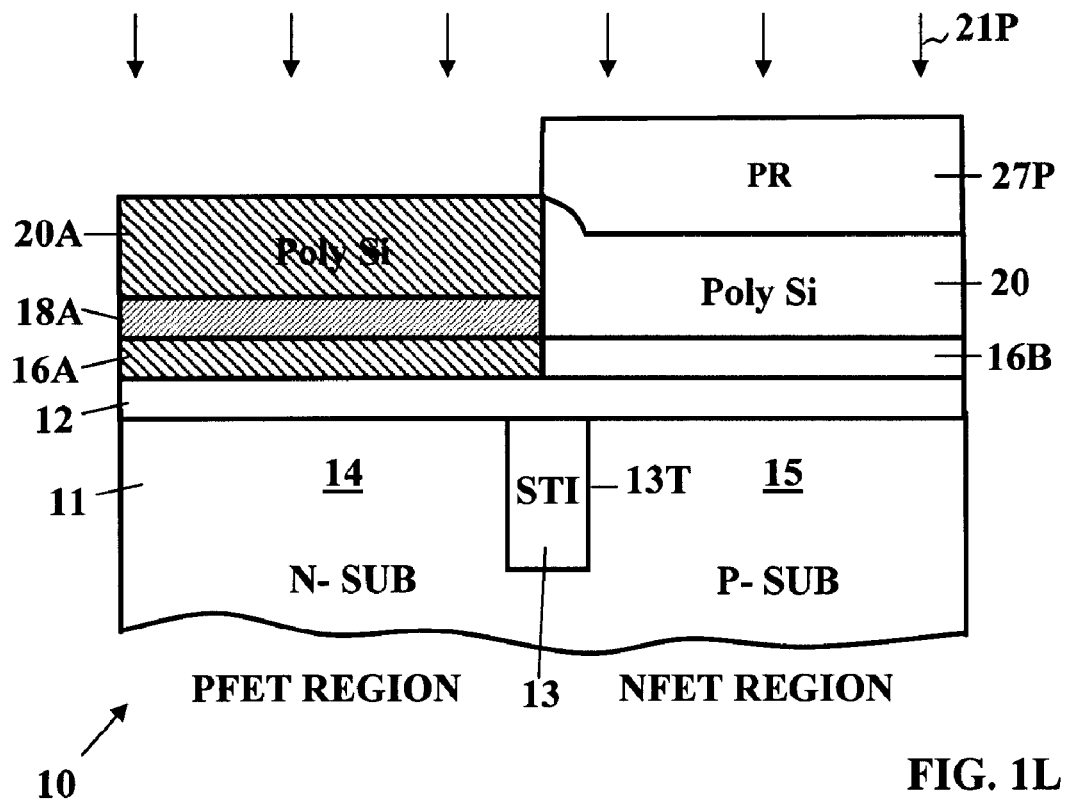
Figure 1M:
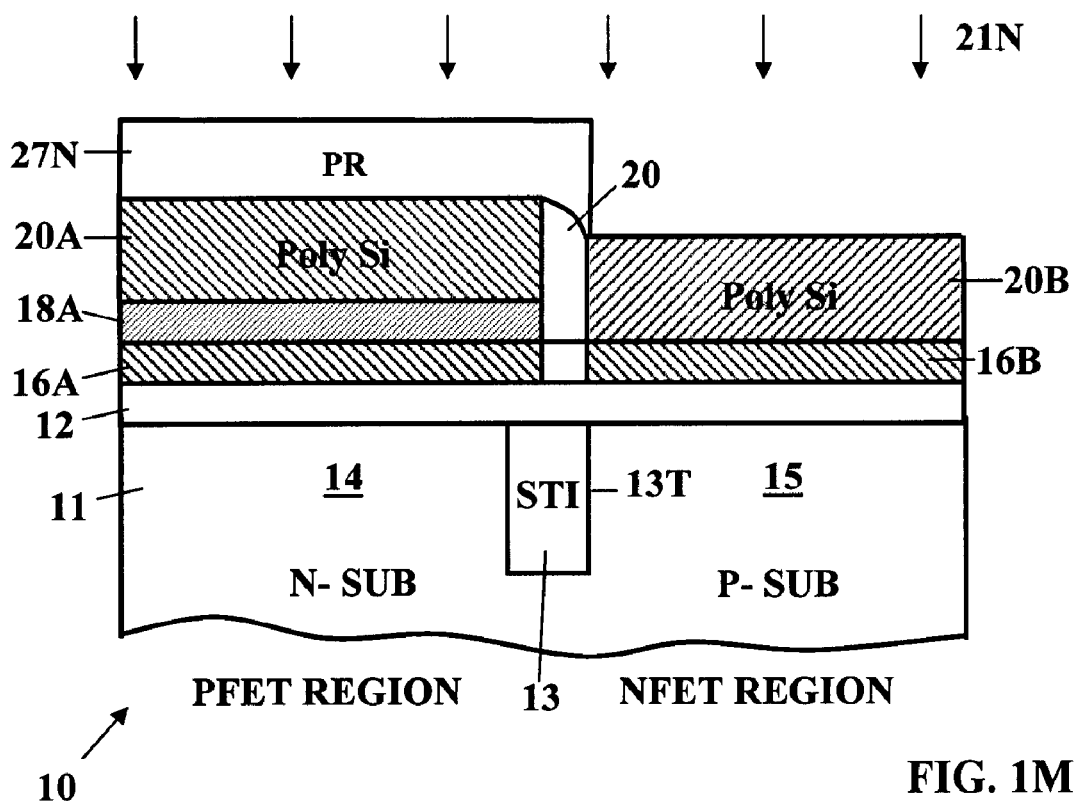

Referring to FIGS. 1L and 1M, in accordance with the usual practice, a masking step is used for pre-doping of the NFET and PFET gates separately.

L. Form Mask Over NFET Region and Dope Gate Electrode Layers Over PFET Region.

Referring to FIG. 1L, the device 10 of FIG. 1K is shown after doping of the NFET gate electrode layers 16A/18A/20A (in accordance with a portion of step 42 in FIGS. 2–4). FIG. 1L shows a mask 27P formed covering the NFET region and leaving the PFET region exposed. Then the layers 16A of polysilicon, SiGe thin film 18A and layer 20A (the left region of layer 20 in the PFET region) to be used to form the gate for PFETs can be doped by implanting either boron ions 21P or boron difluoride (BF$_2$) therein. Preferably, the dopant 21P (boron) is implanted by ion implantation at a energy level of from about 1 keV to about 30 keV with a dose of 1e15 cm$^{-2}$ to 9e15 cm$^{-2}$ yielding a concentration of from about 1e20 cm$^{-3}$ to about 1e21 cm$^{-3}$. The dopant 21P is implanted down into the layers of polysilicon 16A/20A and the poly-Ge thin film 18A.

M. Form Mask Over PFET Region and Dope Gate Electrode Layers Over NFET Region.

Referring to FIG. 1M, the device 10 of FIG. 1L after doping of the PFET gate electrode layers 16B/20B (in accordance with a portion of step 42 in FIGS. 2–4). FIG. 1M shows a mask 27N formed covering the PFET region and leaving the NFET region exposed so that the layer 20 of polysilicon to be used to form the gates for NFETs can be doped by implanting either phosphorus (P) or arsenic (As) ions 21N therein. Preferably, the dopant 21N employed comprises ions 21N (phorphorus (P) or arsenic (As)) which are implanted by ion implantation at a energy level of from about 1 keV to about 30 keV with a dose of 1e15 cm$^{-2}$ to 9e15 cm$^{-2}$ yielding a concentration of from about 1e20 cm$^{-3}$ to about 1e21 cm$^{-3}$. The dopant 21P is implanted down into the layers of polysilicon 16B/20B.

N. Form Gate Electrode Masks On Polysilicon Layers and Etch Unprotected Areas Down to Substrate.

Figure 1N:
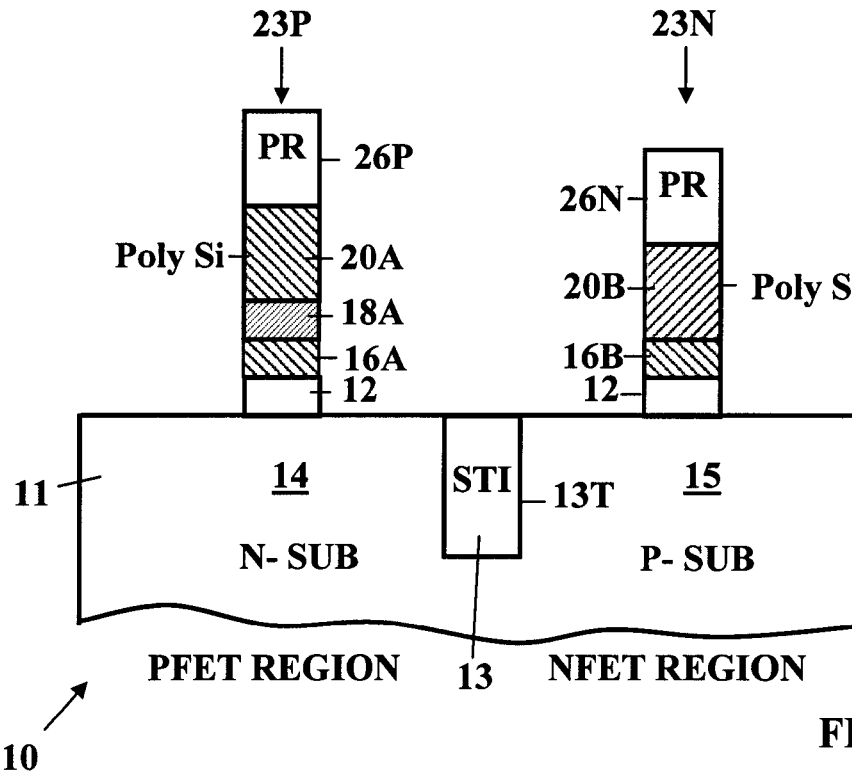

FIG. 1N shows device 10 of FIG. 1M after gate electrode, photolithographic, patterning masks 26P/26N preferably composed of patterned photoresist (PR), have been formed over the over the polysilicon layer 20A/20B. The mask 26P is formed over layer 20A in the PFET region and the mask 26N is formed over layer 20B in the NFET region. Then an etching step is performed (in accordance with the remainder of step 42 in FIGS. 2–4) in which the gate electrode stacks 23P (above the PFET region) and 23N (above the NFET region) have been formed over the N-Sub 14 and the P-Sub 15 respectively by anisotropically etching away the unprotected portions of those layers down to the substrate 11 aside from the masks 26P and 26N respectively.

O. Form LDSs/LDDs; Spacers; & Source/Drain Regions.

Figure 1O:
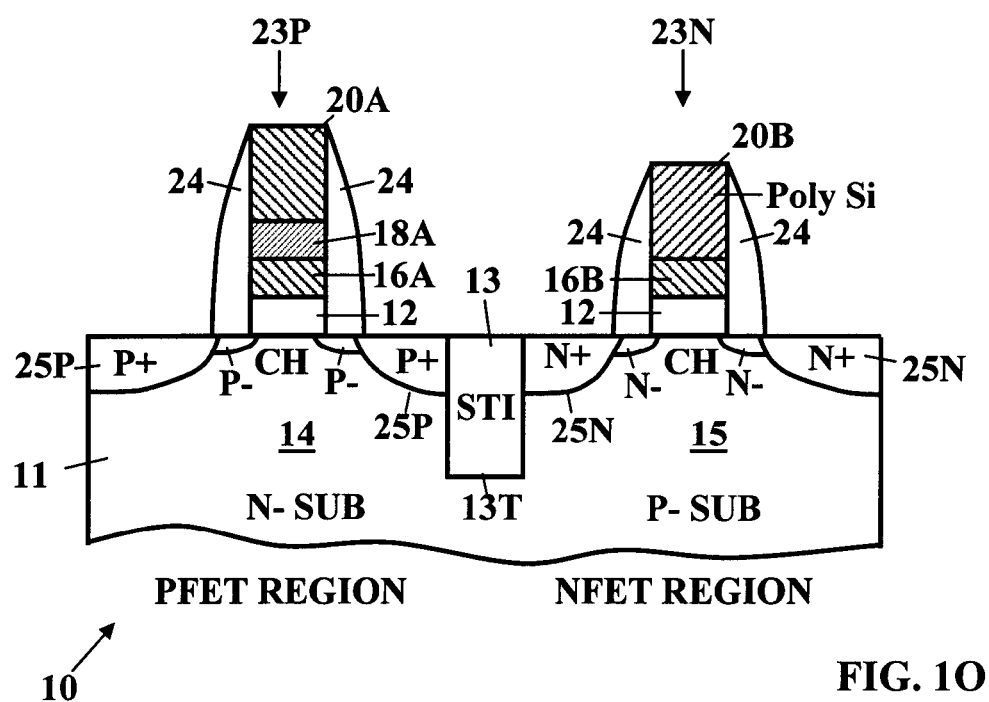

FIG. 1O shows the device 10 of FIG. 1N after an additional PFET Lightly Doped Drain (LDD) doping mask (not shown) and an additional NFET Lightly Doped Source (LDS) doping mask (not shown) were formed in the usual sequence. Using those masks in the usual sequence, the extensions, i.e. the usual Lightly Doped Drain (LDD) P– regions and N– regions and Lightly Doped Source (LDS) P– regions were formed. The extensions include N– regions in the top surface of substrate 11 juxtaposed with the gate electrode stacks 23P and P– regions in the top surface of substrate 11 juxtaposed with the gate electrode stacks 23N, as will be well understood by those skilled in the art (in accordance with a portion of step 43 in FIGS. 2–4).

Next spacers 24 were formed on the sidewalls of the gate electrode stacks 23P and 23N in accordance with conventional process, as indicated in a portion of step 43 in FIGS. 2–4.

Then P+ doped source/drain a mask (not shown) was formed over the NFET region covering the stack 23N, the exposed surface of the P-Sub 15 and a portion of the STI region 13T. Then the P+ doped Source/Drain regions 25P were formed in the surface of the N-Sub 14 self-aligned with the spacers of the stack 23P.

Finally, an N+ doped source/drain a mask (not shown) was formed over the PFET region covering the stack 23P, the exposed surface of the N-Sub 14 and a portion of the STI region 13T. Then the N+ doped source/drain regions 25N were formed in the surface of the P-Sub 15 self-aligned with the spacers of the stack 23N completing step 43 in FIGS. 2–4.

The process shown in FIGS. 2–4 ends at step 44. Other conventional processing continues as will be well understood by those skilled in the art.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

What is claimed is:

1. A method of forming a semiconductor device comprising:
   depositing a silicon thin film onto a dielectric layer formed on a semiconductor substrate;
   depositing an upper thin film on a top surface of said silicon thin film containing germanium;
   patterning and etching said upper thin film using a selective etch leaving said upper thin film intact in a first region and removing said upper thin film exposing said top surface of said silicon thin film in a second region;

diffusing germanium from said upper thin film into said silicon thin film in said first region;

depositing a gate electrode layer covering said upper thin film in said first region and covering said exposed portion of said silicon thin film in said second region;

patterning and etching to form gate electrode stacks; and forming FET devices with sidewall spacers and source regions and drains regions in said substrate aligned with said gate electrode stacks.

2. The method of claim 1 wherein said upper thin film is amorphous or polycrystalline.

3. The method of claim 1 wherein said upper thin film is composed of material selected from the group consisting of amorphous or polycrystalline germanium, silicon germanium, or silicon germanium carbon.

4. The method of claim 1 wherein said upper thin film comprises $Si_{1-X}Ge_X$, where X=5 atomic % to 100 atomic % and Y=0+ % to 5 in the form of amorphous silicon germanium or polysilicon germanium.

5. The method of claim 1 wherein said selective etching is performed with an aqueous solution of $NH_4OH:H_2O_2:H_2O$ at about 65° C.

6. The method of claim 1 wherein said diffusing germanium from said upper thin film into said silicon thin film in said first region is performed by annealing of said semiconductor device for driving germanium into said silicon thin film in said first region at a temperature greater than about 800° C. to interdiffuse Ge into said silicon thin film in said first region.

7. The method of claim 6 wherein Ge diffuses downward into an amorphous or polycrystalline silicon layer in said first region.

8. The method of claim 1 wherein after annealing said semiconductor device native oxide is removed, and polysilicon is deposited over both said first region and said second region followed by gate doping, patterning, and continuation of fabrication of a CMOS device.

9. The method of claim 1 wherein said upper thin film is composed comprises $Si_{1-X-Y}Ge_XC_Y$, where X=5 atomic % to 100 atomic % and Y=0+ atomic % to 2 atomic % in the form of amorphous or polycrystalline silicon germanium carbon.

10. A method of forming a semiconductor device comprising:

depositing a silicon thin film on said dielectric layer formed on a semiconductor substrate containing a PFET region and an NFET region;

depositing an upper thin film on a top surface of said silicon thin film composed of a material selected from the group consisting of amorphous germanium, polycrysatlline germanium, amorphous silicon germanium, polycrystalline silicon germanium, amorphous silicon germanium carbon, and polycrystalline silicon germanium carbon;

patterning and performing selective etching of said upper thin film leaving said upper thin film intact in said PFET region and removing said upper thin film exposing a portion of said top surface of the silicon thin film in said NFET region;

annealing said semiconductor device driving germanium from said upper thin film down into said silicon thin film in said PFET region;

depositing a gate electrode layer covering said upper thin film in said PFET region and covering said exposed portion of said silicon thin film in said NFET region;

patterning and etching to form gate electrode stacks; and forming FET devices in said PFET region and said NFET region wit sidewall spacers juxtaposed with said gate electrode stacks and with source regions and drains regions formed in said substrate self-aligned with said spacers.

11. The method of claim 10 wherein said upper thin film comprises $Si_{1-X-Y}Ge_XX_Y$, where X=5 atomic % to 100 atomic % and Y=0+ atomic % to 5 atomic % in the form of amorphous silicon germanium or polysilicon germanium.

12. The method of claim 10 wherein said selective etching is performed with an aqueous solution of $NH_4OH:H_2O_2:H_2O$ at about 65° C.

13. The method of claim 10 wherein said diffusing germanium from said upper thin film into said silicon thin film in said first region is performed by annealing of said semiconductor device for driving germanium into said silicon thin film in said first region at a temperature greater than about 800° C. to interdiffuse Ge into said silicon thin film.

14. The method of claim 13 wherein Ge diffuses downward into an amorphous silicon layer in said NFET region.

15. The method of claim 10 wherein after annealing said semiconductor device native oxide is removed, and polysilicon is deposited over both said PFET region and said NFET region followed by gate doping, patterning, and continuation of the process of fabrication of a CMOS device.

16. The method of claim 10 wherein said upper thin film comprises $Si_{1-X-Y}GE_XC_Y$, where X=5 atomic % to 100 atomic % and Y=0+ % to 5% in the form of amorphous silicon germanium carbon or polysilicon germanium carbon.

17. A method of forming a semiconductor device comprising:

forming a shallow trench isolation region in a semiconductor substrate;

forming a PFET region and an NFET region in said semiconductor substrate isolated by said shallow trench isolation region;

depositing a silicon thin film on said dielectric layer formed on a semiconductor substrate covering said PFET region and said NFET region, said silicon thin film having a top surface;

depositing an upper thin film on said top surface of said silicon thin film composed of a material selected from the group consisting of amorphous silicon germanium, amorphous silicon germanium carbon, polysilicon germanium and polysilicon germanium carbon;

patterning and etching said upper thin film using a selective etch leaving a remainder of said upper thin film intact above said PFET region and while removing a portion of said upper thin film above said NFET region, thereby exposing said top surface of said silicon thin film in said NFET region;

annealing said semiconductor device driving germanium from said upper thin film down into said silicon thin film in said PFET region;

depositing a gate electrode layer covering said upper thin film in said NFET region and covering said exposed portion of said silicon thin film in said PFET region;

patterning and etching to form gate electrode stacks; and forming FET devices in said PFET region and said NFET region with extensions in said substrate self-aligned with said gate electrode stacks, with sidewall spacers juxtaposed with said gate electrode stacks and with source regions and drains regions formed in said substrate self-aligned with said spacers.

18. The method of claim 17 wherein wherein said upper thin film comprises $Si_{1-X-Y}Ge_XX_Y$, where X=5 atomic % to 100 atomic % and Y=0+ % to 5% in the form of amorphous silicon germanium or polysilicon germanium.

19. The method of claim 17 wherein said upper thin film comprises $Si_{1-X-Y}Ge_XC_Y$, where X=5 atomic % to 100 atomic % and Y=0+ % to 2% in the form of amorphous silicon germanium carbon or polysilicon germanium carbon.

20. The method of claim 17 wherein after annealing said semiconductor device, a native oxide layer is removed, and polysilicon is deposited over both said PFET region and said NFET region followed by gate doping, patterning, and continuation of the process of fabrication of a CMOS device.

* * * * *